US008879303B2

(12) United States Patent
Chandwani et al.

(10) Patent No.: US 8,879,303 B2

(45) Date of Patent: Nov. 4, 2014

(54) PRE-CHARGE TRACKING OF GLOBAL READ LINES IN HIGH SPEED SRAM

(71) Applicant: LSI Corporation, Milpitas, CA (US)

(72) Inventors: Kamal Chandwani, Gujarat (IN); Vikash, Karnataka (IN); Rahul Sahu, Uttar Pradesh (IN)

(73) Assignee: LSI Corporation, Milpitas, CA (US)

( * ) Notice: Subject to any disclaimer, the term of this patent is extended or adjusted under 35 U.S.C. 154(b) by 63 days.

(21) Appl. No.: 13/733,578

(22) Filed: Jan. 3, 2013

(65) Prior Publication Data

US 2014/0185366 A1 Jul. 3, 2014

(51) Int. Cl.

| | |
|---|---|
| ***G11C 11/00*** | (2006.01) |
| ***G11C 7/00*** | (2006.01) |
| ***G11C 7/02*** | (2006.01) |
| ***G11C 8/00*** | (2006.01) |
| ***G11C 7/12*** | (2006.01) |
| ***G11C 11/419*** | (2006.01) |

(52) U.S. Cl.

CPC ................ *G11C 7/12* (2013.01); *G11C 11/419* (2013.01)

USPC ........... 365/154; 365/156; 365/194; 365/203; 365/205; 365/207; 365/208; 365/230.03

(58) Field of Classification Search

USPC ......... 365/154, 156, 194, 203, 205, 207, 208, 365/210.1, 230.03

See application file for complete search history.

(56) References Cited

U.S. PATENT DOCUMENTS

| | | | | |
|---|---|---|---|---|
| 6,385,101 | B1 * | 5/2002 | Chang et al. | 365/194 |
| 6,967,861 | B2 * | 11/2005 | Braceras et al. | 365/154 |
| 7,277,339 | B2 | 10/2007 | Edahiro | |
| 7,755,964 | B2 * | 7/2010 | Jung et al. | 365/210.1 |
| 7,852,693 | B2 | 12/2010 | Christensen et al. | |
| 8,040,746 | B2 * | 10/2011 | Jain et al. | 365/203 |
| 8,576,649 | B1 * | 11/2013 | Nemati | 365/203 |
| 2004/0109366 | A1 | 6/2004 | Moon et al. | |

* cited by examiner

*Primary Examiner* — Trong Phan

(74) *Attorney, Agent, or Firm* — Sheridan Ross P.C.

(57) ABSTRACT

In embodiments of the invention, a memory circuit includes a static random access memory (SRAM), rows of M sense amplifiers, a global read precharge tracking control circuit controlling a precharge of global read lines, a sense amplifier output tracking circuit generating a reset sense amplifier signal for the sense amplifier control circuits, and a read delay circuit generating a trigger signal for the global read precharge tracking control circuit and the sense amplifier output tracking circuit and performing a fixed delay tracking of a read operation in a read cycle. A dummy global read line is coupled to the global read precharge tracking control circuit and returns from a half way to the top of the SRAM forming a tracking dummy global read line that determines a completion of the precharge of the global read lines before the sense amplifiers start discharging the global read lines in the read cycle.

22 Claims, 4 Drawing Sheets

Figure 1:
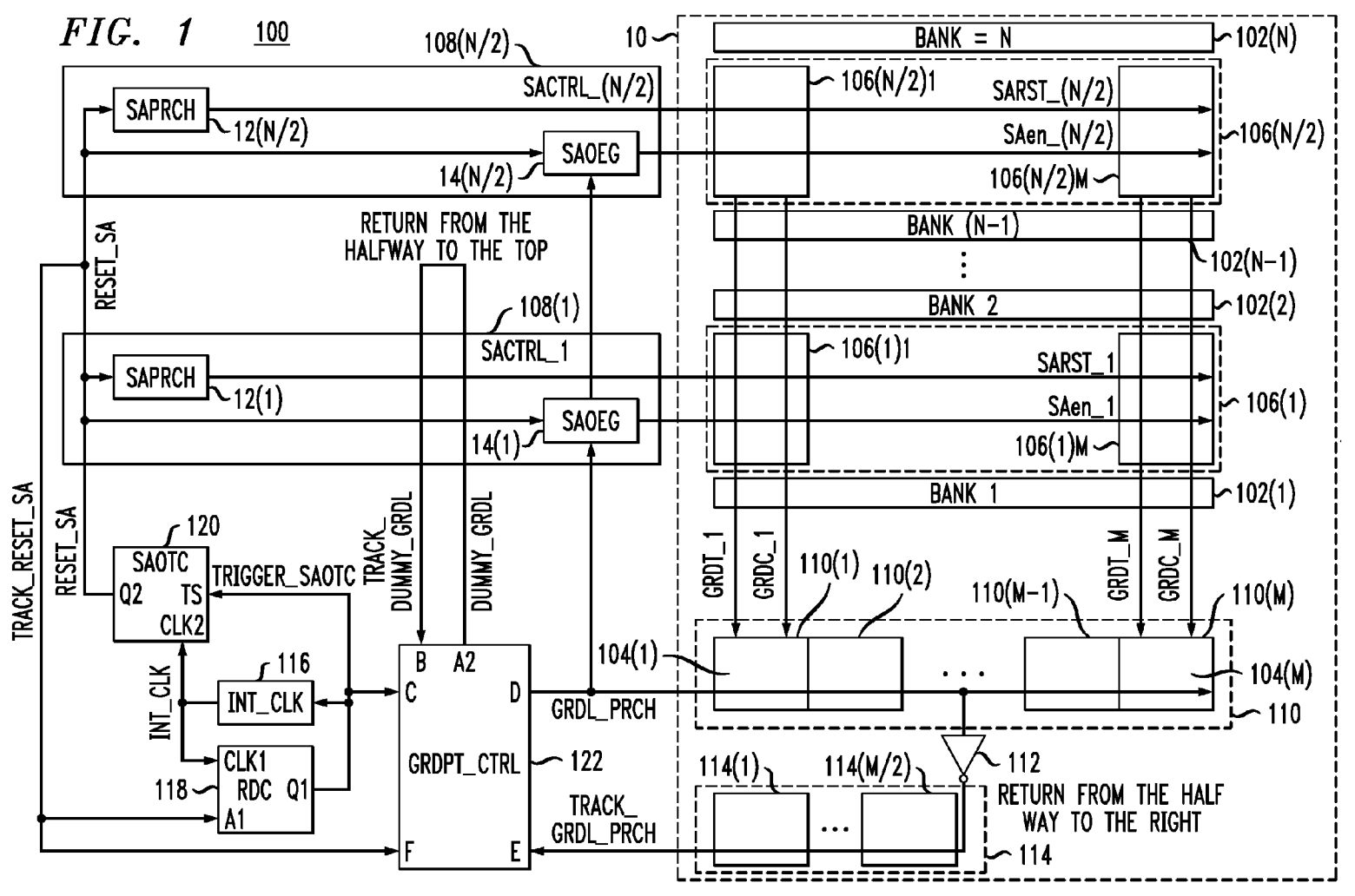

BANK = N
BANK (N−1)
BANK 2
BANK 1
102(N)
102(N−1)
102(2)
102(1)
106(N/2)
106(1)
106(N/2)1
106(N/2)M
106(1)1
106(1)M
SARST_(N/2)
SAen_(N/2)
SARST_1
SAen_1
GRDC_M
GRDT_M
GRDC_1
GRDT_1
110
110(M)
110(M−1)
110(2)
110(1)
104(M)
104(1)
112
RETURN FROM THE HALF WAY TO THE RIGHT
114
114(M/2)
114(1)
SACTRL_(N/2)
108(N/2)
SAOEG
14(N/2)
12(N/2)
SAPRCH
SACTRL_1
108(1)
14(1)
12(1)
RETURN FROM THE HALFWAY TO THE TOP
DUMMY_GRDL
TRACK_DUMMY_GRDL
GRDL_PRCH
122
TRACK_GRDL_PRCH
GRDPT_CTRL
A2
B
C
D
E
F
TRIGGER_SAOTC
116
INT_CLK
CLK1
RDC
Q1
A1
118
120
SAOTC
TS
CLK2
Q2
RESET_SA
TRACK_RESET_SA

400
V
t
1
0
INT_CLK
TRACK_RESET_SA
TRIGGER_SAOTC
GRDL_PRCH
TRACK_DUMMY_GRDL
ONE READ CYCLE
Δt1
402
404
406
408
410
412
414
416
418
420

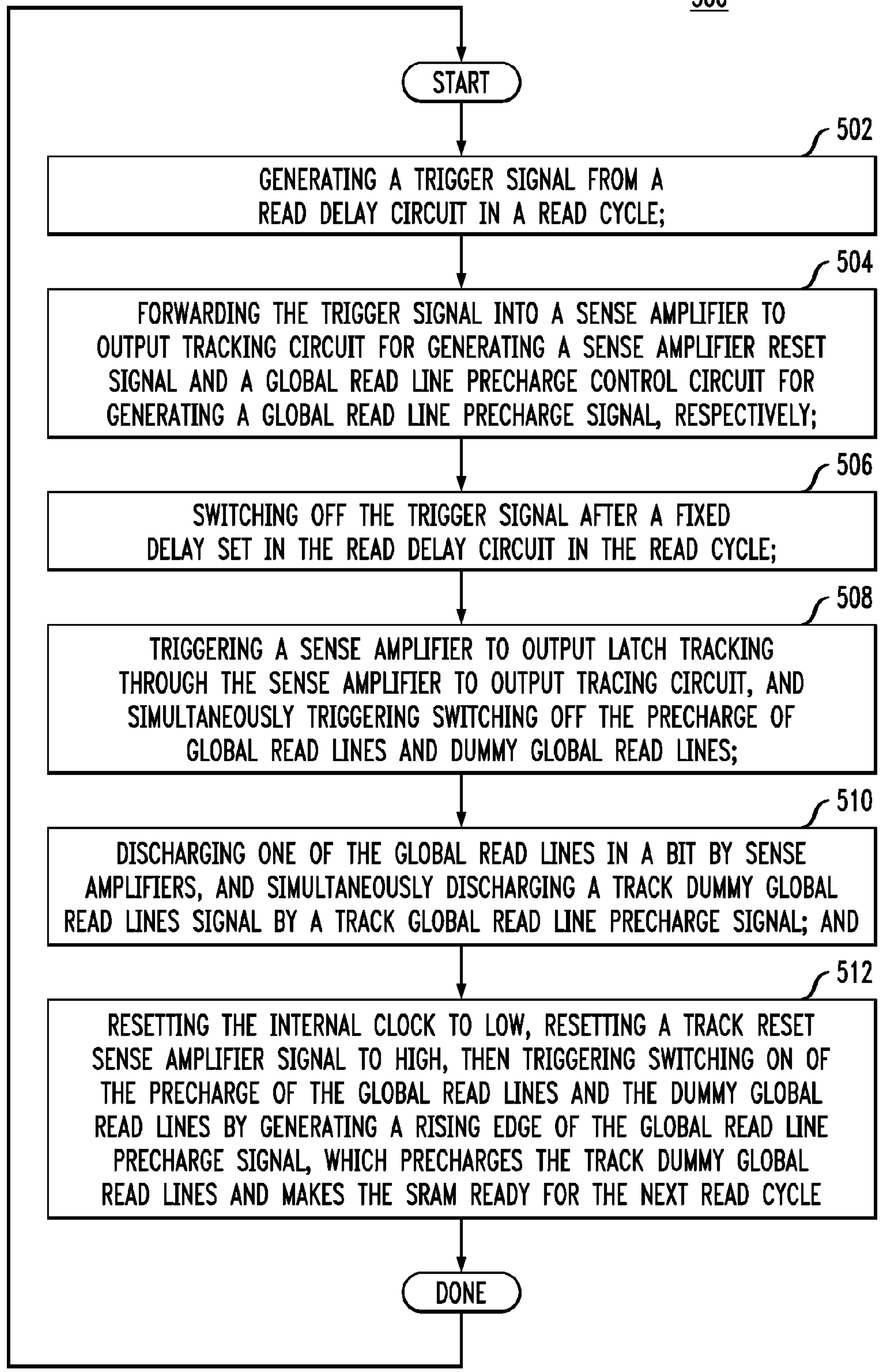
FIG. 5
500
START
502
GENERATING A TRIGGER SIGNAL FROM A READ DELAY CIRCUIT IN A READ CYCLE;
504
FORWARDING THE TRIGGER SIGNAL INTO A SENSE AMPLIFIER TO OUTPUT TRACKING CIRCUIT FOR GENERATING A SENSE AMPLIFIER RESET SIGNAL AND A GLOBAL READ LINE PRECHARGE CONTROL CIRCUIT FOR GENERATING A GLOBAL READ LINE PRECHARGE SIGNAL, RESPECTIVELY;
506
SWITCHING OFF THE TRIGGER SIGNAL AFTER A FIXED DELAY SET IN THE READ DELAY CIRCUIT IN THE READ CYCLE;
508
TRIGGERING A SENSE AMPLIFIER TO OUTPUT LATCH TRACKING THROUGH THE SENSE AMPLIFIER TO OUTPUT TRACING CIRCUIT, AND SIMULTANEOUSLY TRIGGERING SWITCHING OFF THE PRECHARGE OF GLOBAL READ LINES AND DUMMY GLOBAL READ LINES;
510
DISCHARGING ONE OF THE GLOBAL READ LINES IN A BIT BY SENSE AMPLIFIERS, AND SIMULTANEOUSLY DISCHARGING A TRACK DUMMY GLOBAL READ LINES SIGNAL BY A TRACK GLOBAL READ LINE PRECHARGE SIGNAL; AND
512
RESETTING THE INTERNAL CLOCK TO LOW, RESETTING A TRACK RESET SENSE AMPLIFIER SIGNAL TO HIGH, THEN TRIGGERING SWITCHING ON OF THE PRECHARGE OF THE GLOBAL READ LINES AND THE DUMMY GLOBAL READ LINES BY GENERATING A RISING EDGE OF THE GLOBAL READ LINE PRECHARGE SIGNAL, WHICH PRECHARGES THE TRACK DUMMY GLOBAL READ LINES AND MAKES THE SRAM READY FOR THE NEXT READ CYCLE
DONE

PRE-CHARGE TRACKING OF GLOBAL READ LINES IN HIGH SPEED SRAM

BACKGROUND

High speed static random access memory (SRAM) architectures typically use a sense amplifier and two global read lines to load data into an output latch in a global input output (GIO) Block. This requires two operations finished before the sense amplifier starts discharging one of the global read lines. The first operation is a precharging of the global read lines should get completed before a sense amplifier enable signal arrives. The second operation is the global read lines precharging operation should is finished to avoid contention on the global read lines before the sense amplifier starts discharging one of the global read lines. Across various pressure, voltage and temperatures (PVTs) and instance sizes, it is difficult to meet the above two margin conditions and failure to meet these margins results in functional failure of the SRAMs and huge dynamic power consumption.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a memory circuit that includes a static random access memory (SRAM) including N banks of memory cells, each bank having M columns, where M and N are positive integers, rows of M sense amplifiers, each row of the M sense amplifiers placed between two banks of the memory cells, each row of the M sense amplifiers coupled to a sense amplifier control circuit and a local input/output circuit (LIO), each column of the M sense amplifiers corresponding to a bit of the memory cell, the bit having corresponding global read lines, a global read precharge tracking control circuit controlling a precharge of the global read lines using a track dummy global read line signal, a sense amplifier output tracking circuit generating a reset sense amplifier signal for the sense amplifier control circuits, and a read delay circuit generating a trigger signal for the global read precharge tracking control circuit and the sense amplifier output tracking circuit and performing a fixed delay tracking of a read operation in a read cycle. A dummy global read line is coupled to the global read precharge tracking control circuit and returns from a half way to the top of the SRAM forming a tracking dummy global read line that determines a completion of the precharge of the global read lines before the sense amplifiers start discharging the global read lines in the read cycle.

BRIEF DESCRIPTION OF THE DRAWING FIGURES

Other embodiments of the invention will become more fully apparent from the following detailed description, the appended claims, and the accompanying drawings in which like reference numerals identify similar or identical elements.

FIG. 1 is a schematic view of a SRAM system with a precharge tracking of global read lines in accordance with embodiments of the invention;

FIG. 5 is a flowchart showing a method for a precharge tracking of a SRAM in accordance with embodiments of the invention.

DETAILED DESCRIPTION

Figure 2:
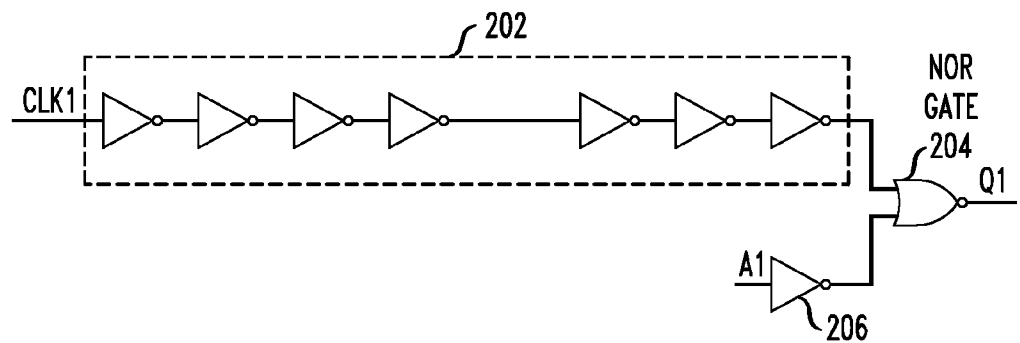
FIG. 2 is an exemplary schematic view of a read delay circuit shown in FIG. 1.

Embodiments of the invention relate to tracking a precharging operation of global read lines (GRDLs) in a SRAM including both horizontal tracking and vertical tracking. The described embodiments provide a configuration and method to detect precharge completion thus allowing margin free tracking across PVTs and instance ranges and thereby improving cycle time and dynamic power. The described embodiments provide following two margin conditions. One is a precharge of the GRDLs that is completed before a sense amplifier enable (SAen) signal arrives. The other one is the GRDLs precharge operation is finished to avoid contention on the GRDLs before a sense amplifier enable signal arrives. The described embodiments provide a margin free READ operation, thereby, improving performance and robustness of the SRAM and a cycle time and dynamic power of the SRAM.

The following detailed description utilizes a number of acronyms, which are generally well known in the art. While definitions are typically provided with the first instance of each acronym, for convenience, Table 1 provides a list of the acronyms and abbreviations used along with their respective definitions.

TABLE 1

| | |
|---|---|
| RDC | Read Delay Circuit |
| SAOTC | Sense Amplifier to Output Tracking Circuit |
| GRDPT_CTRL | Global Read Precharge Tracking Control |
| GIO | Global Input-Output |
| DGIO | Dummy Global Input-Output |
| SACTRL | Sense Amplifier Control |
| SAOEG | Sense Amplifier to Output Generator |
| SAPRCH | Sense Amplifier Precharge |
| SA | Sense Amplifier |
| GRDL | Global Read Line |
| SAen | Sense Amplifier Enable Signal |
| SARST | Sense Amplifier Reset Signal |
| RESET_SA | Reset Sense Amplifier Signal |

Hereinafter, embodiments of the invention are described with reference to the drawing figures.

FIG. 1 is a schematic view of a SRAM with a precharge tracking of global read lines in accordance with embodiments. As shown, SRAM system 100 refers to a general case of N banks and M bits of a SRAM, in which a local input/output (LIO) circuit (not shown) is shared between two banks. Herein a bank refers to an array of core-cells of the SRAM, and N and M are positive integers.

DETAILED DESCRIPTION

As shown in FIG. 1, SRAM system 100 includes SRAM 10, sense amplifier control (SACTRL) circuits 108(1), . . . 108N/2, internal clock circuit (INT_CLK) 116, read delay circuit (RDC) 118, sense amplifier to output tracking circuit (SAOTC) 120, and global read precharge tracking control circuit (GRDPT_CTRL) 122. SRAM 10 includes banks 102(1), 102(2), . . . 102(N−1) and 102N, bits 104(1), 104(2), 104(M−1) and 104M, sense amplifier (SA) rows 106(1), . . . , 106(N/2), global inputs and outputs circuit (GIO) 110, inverter 112, and dummy global inputs and outputs circuit (DGIO) 114.

Banks 102(1), 102(2), . . . 102(N−1) and 102N each is an array of core-cells of SRAM 10. N banks of SRAM 10 each has M bits 104(1), 104(2), 104(M−1) and each bit has two global bitlines. The two global bitlines are GRDT and GRDC. For example, bit 104(1) has global read lines GRDT_1 and GRDC_1; . . . ; bit 104M has global read lines GRDT_M, GRDC_M.

SA rows 106(1), . . . , 106(N/2) each is placed between two banks. For example, SA row 106(1) is placed between bank 102(1) and bank 102(2); SA row 106(2) is placed between bank 102(3) and bank 102(4) (not shown); SA row 106(N/2) is placed between bank 102(N−1) and bank 102N. SA rows 106(1), . . . , 106(N/2) each has M sense amplifiers. For example, SA row 106(1) includes SA106(1)1, . . . 106(1)M; SA row 106(N/2) includes SA 106(N/2)1, . . . 106N/2). Each column of the array of the SAs corresponds to a column of bits in each bank of the core cells. Each column of the sense amplifiers is connected together and coupled to the corresponding GIO of the corresponding bit. For example, SA 106(N/2)M is connected to SA 106(1)M and then coupled to GIO 110M of bit 114M; . . . SA 106(N/2)1 is connected to SA 106(1)1 and then coupled to GIO 110(1) of bit 114(1). Thus, each SA is coupled to the corresponding GRDLs (i.e., GRDT and GRDC). SAs 106(1)1, . . . 106(1)M, . . . 106(N/2)1, . . . 106(N/2)M are implemented with any existing and prospective sense amplifier known in the art.

Each SA row has a sense amplifier control (SACTRL) circuit that controls the each SA row. For example, SACTRL_1 108(1) controls SA row 106(1); SMPCTRL_(N/2) 108(N/2) controls SA row 106(N/2). Each SACTRL circuit includes a sense amplifier precharge (SAPRCH) circuit that generates a sense amplifier reset signal (e.g., SARST_1, . . . , SARST_(N/2)) for the sense amplifiers in the each row. Each SACTRL circuit also includes a sense amplifier to output generator circuit (SAOEG) that generates a sense amplifier enable signal (e.g., SAen_1, . . . , SAen_(N/2)) for the M sense amplifiers in the each row. For example, SACTL_108(1) includes SAPRCH 121 and SAORG 141; SACTL 108(N/2) include SAPRCH 12(N/2) and SAOEG 14(N/2).

GIO 110 includes GIO 110(1), 110(2), . . . 110(M−1) and 110M. Each GIO for the each bit of the N banks is coupled to the each column of the SA array for the each corresponding bit. For example, GIO 110(1) is coupled to SA 106(1)1, . . . , 106(N/2)1 for bit 1041; GIO 110(2) is coupled to SA 106(1)2, . . . , 106(N/2)2 for bit 1042; . . . ; GIO 110(M−1) is coupled to SENAMP 106(1)(M−1), . . . , 106(N/2)(M−1) for bit 104(M−1); GIO 110M is coupled to SENAMP 106(1)M, . . . , 106(N/2)M for bit 104M. A global read line precharge (GRDL_PRCH) signal generated from GRDPT_CTRL 122 is applied to GIO 110 to precharge the GRDLs. At a half way to the right of SRAM 10 the GRDL_PRCH signal propagates to DGIO 114 through inverter 112 forming a horizontal track global read line precharge (TRACK_GRDL_PRCH) signal. The TRACK_GRDL_PRCH signal generated from DGIO 114 then returns to GRDPT_CTRL 122. DGIO 114 includes DGIO 114(1), . . . , 114(M/2) that has a half number of DGIO elements lees than that of GIO 110.

A dummy global read line (DGRDL) coupled to GRDPT_CTRL 122 mimics the GRDLs. A DGRDL signal returns at a half way to the top of SRAM 10 to GRDPT_CTRL 122 forming a vertical track dummy GRDL (TRACK_DUMMY_GRDL) signal.

INT_CLK 116 generates an internal clock (INT_CLK) signal for SRAM system 100. More specifically, as shown in FIG. 1, the INT_CLK is sent into RDC 118 at CLK1 node and SAOTC 120 at CLK2 node.

RDC 118 performs a fixed delay tracking of a READ operation in a READ cycle in SRAM system 100. RDC 116 has two inputs (e.g., A1 and CLK1 nodes) and one output put (e.g., Q1 node). FIG. 2 is an exemplary schematic view of a read delay circuit shown in FIG. 1. As shown, RDC 200 includes inverters 202, NOR gate 204, and inverter 206. Inverters 202 include an even number of inverters connected in series. Inverters 202 and inverter 206 are coupled to inputs of NOR gate 204, respectively. RDC 200 takes the INT_CLK signal as the input at the CLK1 node and a return signal of sense-amplifier reset signal (i.e., TRACK_RESET_SA shown in FIG. 1) as the input at the A1 node. RDC 200 generates a trigger signal (e.g., TRIGGER_SAOTC shown in FIG. 1) as the output at the Q1 node. A default state of the A1 node is HIGH, i.e., the default state of the TRACK_RESET_SA signal is HIGH. When a rising edge of the INT_CLK arrives at the CLK1 node, the output at the Q1 node falls which suggests READ data from a selected bank is ready at the input of the sense-amplifier in the corresponding local IO. Then the output at the Q1 node reaches to SAOTC 120 as the trigger signal (i.e., TRIGGER_SAOTC).

Returning to FIG. 1, SAOTC 120 is a sense-amplifier to output latch tracking that applies any conventional sense-amplifier to output latch tracking method. SAOTC 120 has an input CLK2, a trigger signal input TS node and an output Q2 node. The TRIGGER_SAOTC signal generated from RDC 118 is sent into SAOTC 120 through the TS node. The CLK2 node is a signal split from the TRIGGER_SAOTC signal generated by RDC 118. SAOTC 120 generates a reset sense amplifier (RESET_SA) signal sent to each SACTRL (i.e., SACTRL_1 108(1), . . . , SACTRL_N/2108(N/2), respectively, from the output Q2 node. The SAPRCH and SAOEG in the each SACTRL receive the RESET_SA signal from SAOTC 120 to generate the SAen signals and the SARST signals for the sense amplifiers. For example, SAPRCH 121, . . . , SAPRCH 12(N/2) receive the RESET_SA signal from SAOTC 120 to generate SARST_1, . . . , SARST_(N/2), respectively; and SAOEG 141, . . . SAOEG 14(N/2) receive the RESET_SA signal from SAOTC 120 to generate SAen_1, . . . , SAen (N/2), respectively.

Figure 3:
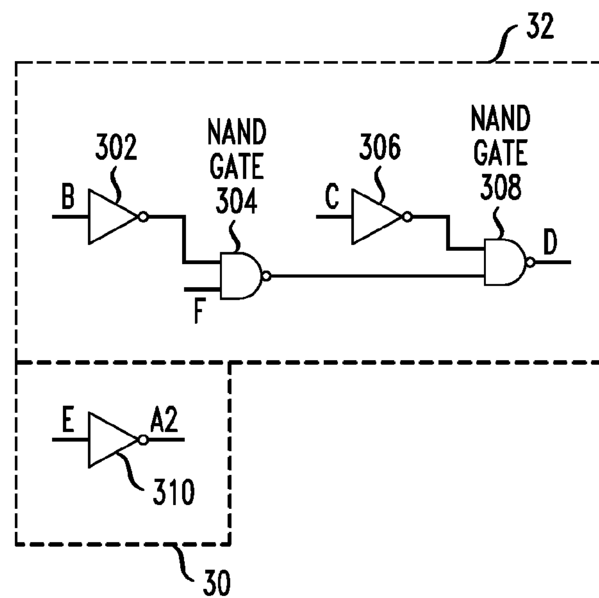
FIG. 3 shows an exemplary schematic view of a global read precharge tracking control circuit shown in FIG. 1.

GRDPT_CTRL circuit 122 controls switching ON and OFF of a precharge of the GRDLs (i.e., all GRDTs and GRDCs) using the TRACK_DUMMY_GRDL signal. FIG. 3 shows an exemplary schematic view of a GRDPT_CTRL circuit shown in FIG. 1.

As shown, GRDL_CTRL circuit 300 includes two circuits 30, 32. Circuit 30 includes inverter 302, NAND gate 304, inverter 306, and NAND gate 308. Inverter 302 is coupled to an input of NAND gate 304. Inverter 306 is coupled to an input of NAND gate 308. An output of inverter 304 is coupled to the other input of NAND gate 308. Circuit 30 has input nodes B, C and F that receive the TRACK_DUMMY_GRDL, TRIGGER_SAOTC, and TRACK_RESET_SA signals, respectively, and an output node D that outputs the GRDL_PRCH signal. Circuit 32 is a signal inverter 310 that has an input node E that inputs the TRACK_GRDL_PRCH signal and an output node A2 that outputs the DUMMY_GRDL signal. When the TRACK_GRDL_PRCH signal arrives at the input node E of circuit 32, the DUMMY_GRDL signal comes out the output node A2 of circuit 32 and then the TRACK_DUMMY_GRDL signal turns back to the input node B of circuit 30. The TRACK_DUMMY_GRDL signal at the input node B then combines with the TRIGGER_SAOTC signal and the TRACK_RESET_SA signal input from the input modes C and F, respectively, to output the GRDL_PRCH signal sending into GIO 110 and SAOEG 141, . . . , SAOEG 14(N/2). Here, the TRACK_DUMMY_GRDL signal is the DUMMY_GRDL signal returning from a half way to the top of SRAM 10 that tracks the DUMMY+GRDL signal; The TRIGGER_SAOTC signal is shared with SAOTC 118; The TRACK_GRDL_PRCH signal is the GRDL_PRCH signal returning from a half way to the right of SRAM 10 that tracks the GRDL_PRCH signal. The TRACK_RESET_SA signal is the REST_SA signal returning from the half way to the top of SRAM 10 that tracks the REST_SA signal.

Referring to FIG. 1, when the INT_CLK transitions HIGH, the TRIGGER_SAOTC signal falls, which causes the TRACK_DUMMY_GRDL signal HIGH and subsequently switch OFF the precharge of the GRDLs (i.e., the GRDT__1, GRDC__1, . . . , GRDT_M, and GRDC_M) in GIO 110. Simultaneously, the GRDL_PRCH signal turns halfway from the right of SRAM 10 and returns to GRDPT_CTRL circuit 122 as the TRACK_GRDL_PRCH signal at the input E node, which is a horizontal tracking of the GRDL_PRCH signal. A rising of the TRACK_GRDL_PRCH signal discharges the DUMMY_GRDL at the output A2 node which travels the half way from the top of SRAM 10 and return to GRDPT_CTRL circuit 122 as the TRACK_DUMMY_GRDL signal that is a vertical tracking of the sense amplifier storing data on the GRDLs. Then GRDPT_CTRL circuit 122 waits for a rising edge of the TRACK_RESET_SA signal which triggers a rising edge of the GRDL_PRCH and, in turn, precharge the DUMMY_GRDL and the GRDLs and make GRDPT_CTRL circuit 122 ready for the next cycle.

Figure 4:
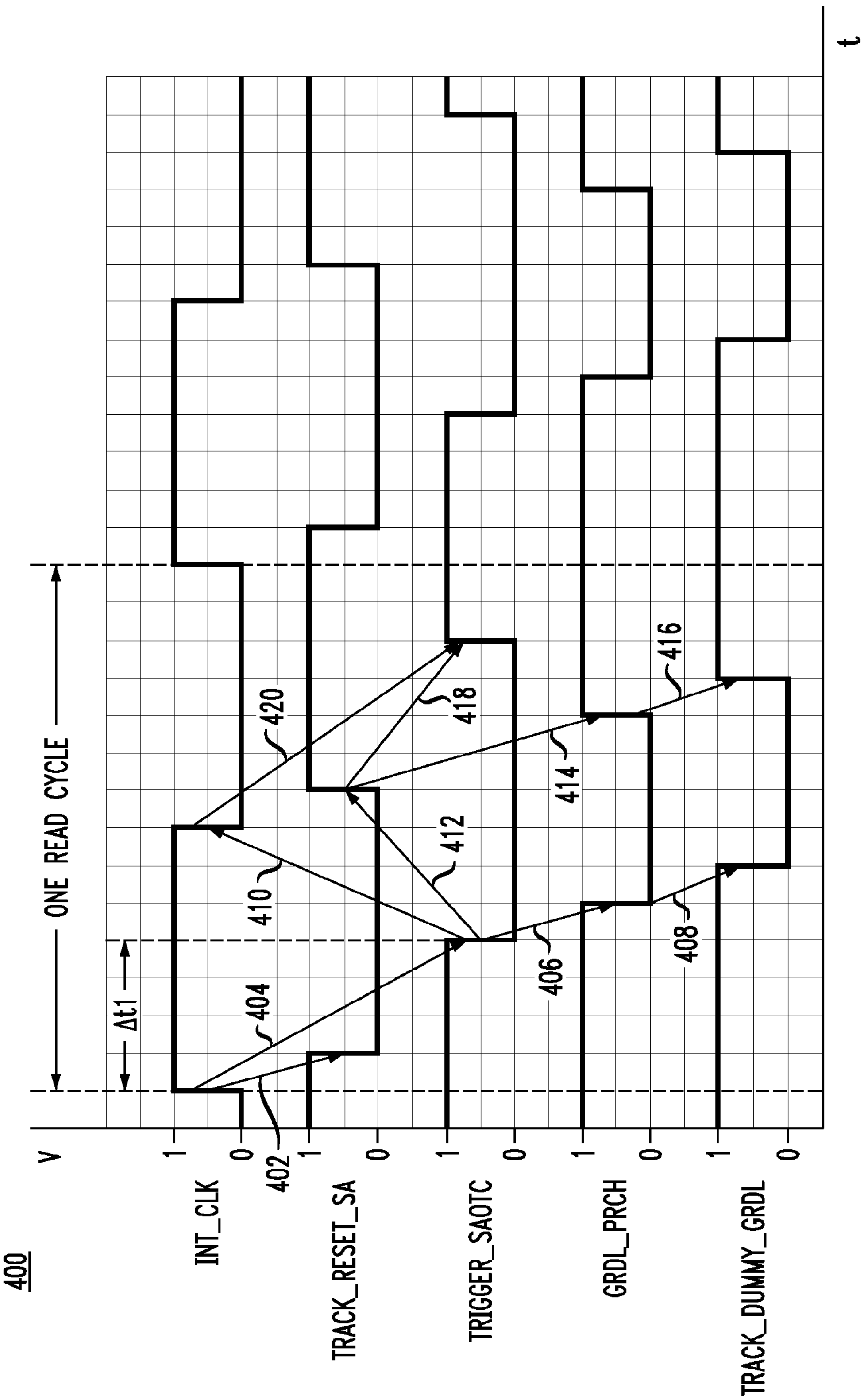
FIG. 4 is an exemplary timing diagram of the SRAM with a precharge tracking of the global read lines shown in FIG. 1.

FIG. 4 is an exemplary timing diagram of the SRAM system with a precharge tracking of the global read lines shown in FIG. 1. As shown, arrows with numeral labels represent events occurring during a READ cycle. As shown, waveform 400 includes waveforms of an INT_CLK, TRACK_RESET_SA, TRIGGER_SAOTC, GRDL_PRCH and TRACK_DUMMY_GRDL. Here, the INT_CLK represents an internal clock signal generated by INT_CLK 116; the TRACK_RESET_SA represents a signal formed by a RESET_SA signal travelling a half way to the top of SRAM 10; the TRIGGER_SAOTC represents a signal generated by RDC 118; the GRDL_PRCH represents a precharge signal of global read lines (GRDLs) (e.g., GRDT_1, . . . , GRDT_M and GRDC_1, . . . , GRDC_M in GIO 110); the TRACK_ DUMMY_GRDL represents a vertical tracking of a DUMMY_GRDL signal travelling a half way to the top of SRAM 10. Referring to FIG. 4, a default state of the TRACK_RESET_SA signal is HIGH (e.g., "1"). At event 402, as a rising edge of the INT_CLK signal arrives in the READ cycle, the TRACK_RESET_SA signal goes LOW (e.g., "0") and the TRIGGER_SAOTC signal falls after a fixed delay Δt1 set in RDC 118 (at event 404). Then the TRIGGER_SAOTC signal triggers two operations. One operation is the TRIGGER_SAOTC signal triggers a sense amplifier to output latch tracking through SAOTC 120 with the states of RESET_SA and TRACK_RESET_SA signals. When the TRIGGER_SAOTC signal goes LOW, the TRACK_RESET_SA goes HIGH after a period of time. This triggers the sense amplifier to output latch tracking. The other operation at event 406 is the TRIGGER_SAOTC signal triggers switching OFF the GRDL_PRCH and a DUMMY_GRDL, provided the TRACK_DUMMY_GRDL is HIGH, through a falling edge of the GRDL_PRCH signal. If the TRIGGER_SAOTC signal falls and the TRACK_DUMMY_GRDL is not HIGH, then the TRIGGER_SAOTC signal waits for the arrival of a rising edge of the TRACK_DUMMY_GRDL. As soon as the GRDL_PRCH and the DUMMY_GRDL switch OFF, sense amplifiers (SA 106(1)1, . . . , 106(1)M, . . . , 106(N/2)1, . . . , 106(N/2)M) in local inputs/outputs circuit (LIOs) starts discharging one of the GRDLs in each bit, i.e. discharging of either GRDT_1, . . . , GRDT_M or GRDC_1, . . . , GRDC_M depending upon data stored in corresponding address locations in a bank. Simultaneously, at event 408, the TRACK_GRDL_PRCH signal, which represents a horizontal tracking of the GRDL_PRCH, starts discharging the TRACK_DUMMY_GRDL signal by passing the TRACK_ GRDL_PRCH signal from circuit 32 to circuit 30 as shown in FIG. 3. Since the TRACK_DUMMY_GRDL is the return signal of the DUMMY_GRDL from the halfway to the top of SRAM 10, the TRACK_DUMMY_GRDL mimics a vertical tracking of discharging of the GRDLs. Simultaneously, SAOTC 120 resets the INT_CLK signal to LOW at event 410, reset the TRACK_RESET_SA signal to HIGH at event 412, and trigger switching ON the pre-charge of the GRDLs and the DUMMY_GRDLs by generating a rising edge of the GRDL_PRCH at event 414. This pre-charges the TRACK_ DUMMY_GRDL for next READ cycle at event 416. At events 418 and 420, upon a rest of the INT_CLK signal at event 410 and a rest of the TRACK_RESET_SA signal at event 412, RDC 118 has the TRIGGER_SAOTC signal HIGH thereby, making SRAM system 100 ready for the next READ cycle.

FIG. 5 is a flowchart showing a method for a precharge tracking of a SRAM in accordance with exemplary embodiments.

As shown, at step 502, a trigger signal is generated from a read delay circuit by receiving an internal clock and a track sense amplifier rest signal in a read cycle. When a rising edge of the internal clock arrives, the track reset sense amplifier signal goes to LOW from a default state of HIGH. At step 504, the trigger signal is forwarded into a sense amplifier to output tracking circuit for generating a reset sense amplifier signal for sense amplifier control circuits to reset sense amplifiers and a global read line precharge control circuit for generating a global read line precharge signal for precharge of global read lines and dummy global read lines, respectively. At step 506, the trigger signal is switched OFF after a fixed delay set in the read delay circuit in the read cycle. This results in following two operations at step 508. One operation triggers a sense amplifier to output latch tracking through the sense amplifier to output tracking circuit. The other operation simultaneously triggers switching OFF a precharge of global read lines and dummy global read lines. At step 510, after switching OFF the precharge of the global read lines and the dummy global read lines, sense amplifiers start discharging one of the global read lines in a bit depending on data stored in corresponding address locations in a bank of the SRAM. Simultaneously, a track global read line precharge signal starts discharging a track dummy global read lines signal coupled to the global read line precharge control circuit. At step 512, the internal clock is reset to LOW, the track reset sense amplifier signal is reset to HIGH. Then the precharge of the global read lines and the dummy global read lines is triggered to switch ON by generating a rising edge of the global read line precharge signal, which precharges the track dummy global read lines and make the SRAM ready for the next read cycle.

The advantages of the described embodiments are as follows. A precharge of the global read lines (GRDLs) (i.e., all GRDTs and GRDCs in GIO 110) using the GRDL_PRCH signal is finished before the sense-amplifier starts discharging the GRDLs. This ensures that a READ operation does not fail due to an early arrival of the TRIGGER_SAOTC signal. This also improves an access time and cycle time of SRAMs by eliminating possible contention on the GRDLs between the sense amplifier enable signals (SAens) and the TRIGGER_SAOTC signals. Furthermore, the described embodiments ensure that short circuit current on the GRDLs due to the sense-amplifier discharging the GRDLs and the TRIGGER_SAOTC signal pre-charging the GRDLs is eliminated across all PVTs and instance sizes of the SRAM, thus, providing a GRDL precharge operation a margin free tracking of the GRDL precharge operation. This enhances the performance and robustness of the SRAMs across PVTs and instance sizes. Furthermore, in the described embodiments, the GRDL precharge operation is tracked, which results in a significant improvement in a cycle time and dynamic power.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment of the invention, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Although the subject matter described herein is described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the embodiments are not so limited. As would be apparent to one skilled in the art, various functions of circuit elements are also implemented as processing blocks in a software program. Such software is employed in, for example, a digital signal processor, micro-controller, or general purpose computer.

Unless explicitly stated otherwise, each numerical value and range should be interpreted as being approximate as if the word "about" or "approximately" preceded the value of the value or range.

The use of figure numbers and/or figure reference labels in the claims is intended to identify one or more embodiments of the invention in order to facilitate the interpretation of the claims. Such use is not to be construed as necessarily limiting the scope of those claims to the embodiments shown in the corresponding figures.

It should be understood that the steps of the embodiments of the invention that are methods set forth herein are not necessarily required to be performed in the order described, and the order of the steps of such methods should be understood to be merely exemplary. Likewise, additional steps are included in such methods, and certain steps are omitted or combined, in methods consistent with various embodiments.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground is considered a power source having a voltage of approximately zero volts, and a power source having any desired voltage is substituted for ground. Therefore, all gates are powered by at least two power sources, with the attendant digital signals therefrom having voltages that range between the approximate voltages of the power sources.

Signals and corresponding nodes or ports are referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the embodiment is implemented using bi-polar transistor technology.

No claim element herein is to be construed under the provisions of 35 U.S.C. §112, sixth paragraph, unless the element is expressly recited using one of the phrases "means for" or "step for."

It will be further understood that various changes in the details, materials, and arrangements of the parts which have been described and illustrated in order to explain of described embodiments may be made by those skilled in the art without departing from the scope as expressed in the following claims.

We claim:

1. A memory circuit, comprising:

a static random access memory including N banks of memory cells, each bank having M columns, where M and N are positive integers;

rows of M sense amplifiers, each row of the M sense amplifiers placed between two banks of the memory cells, each row of the M sense amplifiers coupled to a sense amplifier control circuit and a local input/output circuit, each column of the M sense amplifiers corresponding to a bit of the memory cell, the bit having corresponding global read lines;

a global read precharge tracking control circuit controlling a precharge of the global read lines using a track dummy global read line signal;

a sense amplifier output tracking circuit generating a reset sense amplifier signal for the sense amplifier control circuits; and a read delay circuit generating a trigger signal for the global read precharge tracking control circuit and the sense amplifier output tracking circuit and performing a fixed delay tracking of a read operation in a read cycle;

wherein a dummy global read line is coupled to the global read precharge tracking control circuit and returns from a half way to the top of the static random access memory forming a tracking dummy global read line that determines a completion of the precharge of the global read lines before the sense amplifiers start discharging the global read lines in the read cycle.

2. The memory circuit of claim 1, wherein an internal clock signal is provided to the read delay circuit and the sense amplifier output tracking circuit, respectively.

3. The memory circuit of claim 1, wherein the trigger signal generated from the read delay circuit transitions to a LOW state after a fixed delay set in the read delay circuit, which triggers a sense amplifier to output latch tracking through the sense amplifier output tracking circuit, and also triggers switching OFF the precharge of the global read lines and the dummy global read line through the global read precharge tracking control circuit, and subsequently, the sense amplifiers in the local input/output circuit start discharging the global read lines depending on data stored in corresponding address locations in a bank in the read cycle, and a track global read line precharge signal starts discharging the track dummy global read line.

4. The memory circuit of claim 1, where the track global read line precharge signal is a return signal of the global read line precharge signal from a half way to the right of the static random access memory.

5. The memory circuit of claim 1, wherein the static random access memory includes a global input and output circuit that has M global input and output circuit elements and a dummy global input and output circuit that has a half number of dummy global input and output circuit elements less than the global input and output circuit, each global input and output circuit element is coupled to a corresponding column of the static random access memory, and the M sense amplifiers in the each column are connected together and coupled to the corresponding global input and output circuit element of the corresponding column.

6. The memory circuit of claim 5, wherein an inverter is coupled to the global input and output circuit and the dummy global input and output circuit at the half way of the global input and output circuit and the end of the dummy global input and output circuit, coverts the global read line precharge signal from the global input and output circuit, and sends the converted global read line precharge signal to the dummy global input and output circuit.

7. The memory circuit of claim 6, wherein the global read line precharge signal travels along the global input and output circuit and returns to the global read precharge tracking control circuit from a half way to the right of the static random access memory through the inverter and the dummy global input and output circuit, forming a track global read line precharge signal that discharges the tracking dummy global read line signal in the read cycle.

8. The memory circuit of claim 1, wherein each sense amplifier control circuit includes a sense amplifier precharge circuit for precharging the sense amplifier by generating a sense amplifier reset signal and a sense amplifier to output generator that generates a sense amplifier enable signal for the each row of the M sense amplifiers, both are triggered by the reset sense amplifier signal generated from the sense amplifier output tracking circuit, and the sense amplifier to output generator also receives the global read line precharge signal from the global read precharge tracking control circuit.

9. The memory circuit of claim 1, wherein the sense amplifier output tracking circuit is a sense-amplifier to output latch.

10. The memory circuit of claim 1, wherein the read delay circuit includes two individual inverters coupled to NOR gate inputs of a NOR gate, respectively, and an inverter block having an even number of inverters connected in series and coupled to one of the two individual inverters.

11. The memory circuit of claim 1, wherein global read precharge tracking control circuit includes a first circuit having a single inverter and a second circuit having two NAND gates, each NAND gates has an inverter coupled to a NAND gate input, and a NAND gate output of a first NAND gate is couple to another NAND gate input of a second NAND gate.

12. The memory circuit of claim 11, wherein the track global read line precharge signal is input to the first circuit and the dummy global read line is output from the first circuit.

13. The memory circuit of claim 11, wherein the trigger signal, the track dummy global read line signal and the track reset sense amplifier signal are input to the second circuit and the global read line precharge signal is output from the second circuit.

14. The memory circuit of claim 1, wherein the reset sense amplifier signal returns from a half way to the top of the static random access memory forming a track reset sense amplifier signal that is sent into the read delay circuit and the global read precharge tracking control circuit, respectively, in the read cycle.

15. The memory circuit of claim 1, wherein a default state of the track reset sense amplifier signal is HIGH, when a rising edge of the internal clock arrives in the read cycle, the track reset sense amplifier signal switches to LOW, when the internal clock is reset by the sense amplifier to output tracking circuit to LOW, the track reset sense amplifier signal transitions to HIGH.

16. A method for a precharge tracking of global read lines in a high speed static random access memory system, the method comprising the steps of:

generating a trigger signal from a read delay circuit by receiving an internal clock and a track sense amplifier rest signal in a read cycle, wherein when a rising edge of the internal clock arrives, the track reset sense amplifier signal goes to LOW from a default state of HIGH;

forwarding the trigger signal into a sense amplifier to output tracking circuit for generating a reset sense amplifier signal for sense amplifier control circuits to reset sense amplifiers and a global read line precharge control circuit for generating a global read line precharge signal for precharge of global read lines and dummy global read lines, respectively;

switching OFF the trigger signal after a fixed delay set in the read delay circuit in the read cycle;

triggering a sense amplifier to output latch tracking through the sense amplifier to output tracking circuit, and simultaneously triggering switching OFF the precharge of global read lines and dummy global read lines;

discharging one of the global read lines in a bit depending on data stored in corresponding address locations in a bank of the static random access memory by sense amplifiers, and simultaneously discharging a track dummy global read lines signal coupled to the global read line precharge control circuit by a track global read line precharge signal; and resetting the internal clock to LOW, resetting the track reset sense amplifier signal to HIGH, then triggering switching ON of the precharge of the global read lines and the dummy global read lines by generating a rising edge of the global read line precharge signal, which precharges the track dummy global read lines and makes the static random access memory ready for the next read cycle.

17. The method of claim 16, wherein the read delay circuit sets the trigger signal HIGH along with the resetting the internal clock and a HIGH state of the track reset sense amplifier signal.

18. The method of claim 16, wherein in the step of the triggering switching OFF the precharge of the global read lines and the dummy global read lines includes the track dummy global read line signal is HIGH through a falling edge of the global read line precharge signal.

19. The method of claim 16, wherein if the track dummy global read line signal is not HIGH, the trigger signal wait for an arrival of a rising edge of the track dummy global read line signal.

20. The method of claim 19, wherein the track dummy global read line signal is a return signal of the dummy global read lines coupled to the global read line precharge control circuit from a half way to the top of the static random access memory.

21. The method of claim 16, wherein the track global read line precharge signal is a return signal of the global read line precharge signal from a half way to the right of the static random access memory.

22. The method of claim 16, wherein the track reset sense amplifier signal is a return signal of the reset sense amplifier signal from a half way to the top of the static random access memory.

* * * * *